US008871621B2

(12) United States Patent
Ananthan et al.

(10) Patent No.: US 8,871,621 B2
(45) Date of Patent: Oct. 28, 2014

(54) METHOD OF FORMING AN ASYMMETRIC MIMCAP OR A SCHOTTKY DEVICE AS A SELECTOR ELEMENT FOR A CROSS-BAR MEMORY ARRAY

(71) Applicant: Intermolecular, Inc., San Jose, CA (US)

(72) Inventors: Venkat Ananthan, Cupertino, CA (US); Imran Hashim, Saratoga, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 15 days.

(21) Appl. No.: 13/722,885

(22) Filed: Dec. 20, 2012

(65) Prior Publication Data
US 2014/0175603 A1 Jun. 26, 2014

(51) Int. Cl.
H01L 21/20 (2006.01)
H01L 21/36 (2006.01)
H01L 49/02 (2006.01)

(52) U.S. Cl.
CPC ..................................... *H01L 28/40* (2013.01)
USPC ......................................................... 438/570

(58) Field of Classification Search
None
See application file for complete search history.

(56) References Cited

U.S. PATENT DOCUMENTS

| | | | | |
|---|---|---|---|---|
| 2001/0054730 A1* | 12/2001 | Kim et al. | | 257/301 |
| 2008/0157157 A1* | 7/2008 | Tonomura et al. | | 257/300 |
| 2011/0204475 A1* | 8/2011 | Rui et al. | | 257/532 |

OTHER PUBLICATIONS

Park, et al.; A Pt/TiO2/Ti Schottky-type Selection Diode for Alleviating the Sneak Current in Resistance Switching Memory Arrays; Apr. 19, 2010; IOP Publishing Ltd.; Nanotechnology 21; pp. 1-4.
Kim, G., et al.; Schottky Diode With Excellent Performance for Large Integration Density of Crossbar Resistive Memory; May. 24, 2012; 2012 American Institute of Physics; Applied Physics Letters; pp. 213508-1-213508-3.
Tallarida et al.; Low temperature rectifying junctions for crossbar non-volatile memory devices; 2009; IEEE; 3 pages.
Lee, W., et al.; Varistor-type Bidirectional Switch (JMAX>107A/cm2, Selectivity~104) for 3D Bipolar Resistive Memory Arrays; 2012; IEEE; 2012 Symposium on VLSI Technology Digest of Technical Papers; pp. 37-38.
Huang, J., et al.; Bipolar Nonlinear Ni/TiO2/Ni Selector for 1S1R Crossbar Arrary Applications; Oct. 2011; IEEE; IEEE Electron Device Letters, vol. 32, No. 10; pp. 1427-1429.
Czubatyj, W., et al.; Invited Paper: Thin-Film Ovonic Threshold Switch: Its Operation and Application in Modern Integrated Circuits; 2012; Electronic Materials Letters, vol. 8, No. 2; pp. 157-167.
Burr, G.W., et al.; Large-scale (512kbit) Integration of Multilayer-ready Access-Devices based on Mixed-Ionic-Electronic-Conduction (MIEC) at 100% yield; 2012; IEEE; 2012 Symposium on VLSI Technology Digest of Technical Papers; pp. 41-42.

* cited by examiner

*Primary Examiner* — Charles Garber
*Assistant Examiner* — Brigitte Paterson

(57) ABSTRACT

MIMCAP devices are provided that can be suitable for memory device applications, such as current selector devices for cross point memory array. The MIMCAP devices can have lower thermal budget as compared to Schottky diodes and controllable lower barrier height and lower series resistance as compared to MIMCAP tunneling diodes. The MIMCAP diode can include a low defect dielectric layer, a high defect dielectric layer, sandwiched between two electrodes having different work function values.

7 Claims, 11 Drawing Sheets

Forming a first layer on a substrate, wherein the first layer is operable as an electrode
1000

Forming a second layer on the first layer, wherein the second layer comprises a dielectric layer
1010

Forming a third layer on the second layer, wherein the third layer comprises a dielectric layer, wherein the third layer has more defects than the second layer
1020

Forming a fourth layer on the third layer, wherein the fourth layer is operable as an electrode
1030

*FIG. 10*

METHOD OF FORMING AN ASYMMETRIC MIMCAP OR A SCHOTTKY DEVICE AS A SELECTOR ELEMENT FOR A CROSS-BAR MEMORY ARRAY

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current selector elements, such as diodes and/or transistors. Selector devices in non volatile memory structures can screen the memory elements from sneak current paths to ensure that only the selected bits are read or programmed. Schottky diode can be used as a selector device, which can include p-n junction diode or metal-semiconductor diode, which requires high thermal budget that may not be acceptable for 3D memory application. Metal-Insulator-Metal Capacitor (MIMCAP) tunneling diodes may have a challenge of getting controllable low barrier height and low series resistance.

Therefore, there is a need for a selector device that can meet the design criteria for advanced memory devices.

SUMMARY

In some embodiments, MIMCAP devices are provided that can be suitable for memory device applications. The MIMCAP device can have lower thermal budget as compared to Schottky diodes and controllable lower barrier height and lower series resistance as compared to MIMCAP tunneling diodes.

In some embodiments, the MIMCAP device can include an asymmetric device having an electrode/dielectric stack in contact with a dielectric/electrode stack. The dielectric layers and/or the electrodes can have different compositions to generate an asymmetric device with respect to the two electrode/dielectric stacks. For example, the dielectric layers can include two dielectric layers having different defect levels, e.g., one dielectric layer has more embedded defects then the other dielectric layer. The electrodes can include two conductive materials having different work function values. The defect level and the work function differences can be optimized to achieve a high forward bias current density (e.g., $10^5$-$10^6$ A/cm$^2$) and a high forward to reverse rectification ratio (e.g., $10^7$-$10^8$).

In some embodiments, methods to form MIMCAP devices are provided, including performing treatments after depositing the low defect dielectric layer, the high defect dielectric layer, and/or the electrodes. The treatment can include rapid thermal annealing or plasma treatment, such as a rapid thermal anneal in temperatures between 200 and 400 C, plasma oxygen anneal, and/or in-situ annealing after deposition. The treatments can modify the deposited layers to achieve the desired device characteristics.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 10 illustrates a flowchart for forming a MIMCAP device according to some embodiments.

DETAILED DESCRIPTION

Figure 1:
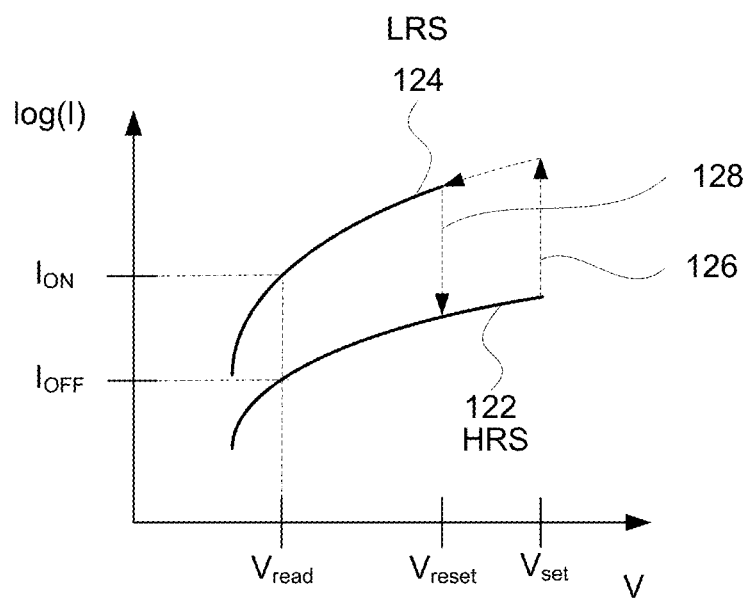
FIG. 1 illustrates a plot of a current passing through a ReRAM cell as a function of a voltage applied to the ReRAM cell, according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, selector devices, and methods to fabricate selector devices, for resistive-switching memory elements and cross point memory array are provided. The selector device can be constructed using familiar and available materials currently used in fabrication facilities. The fabrication process of the selector device can require low thermal budget, suitable for back end or 3D memory applications. In addition, the process can be simple, providing a robust process for manufacturing.

In some embodiments, the selector devices can include a low defect dielectric and a high defect dielectric sandwiched between two electrodes. The low defect dielectric layer can function to restrict the current flow across the MIMCAP device, especially at the reverse bias condition. The high defect dielectric layer can function to enhance the current flow across the MIMCAP device, especially at the forward bias condition. The defect levels of the high and low defect dielectrics and the work function difference of the two electrodes can be optimized to achieve high forward bias current, together with high ratio of forward to reverse current at the operation voltages.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), Chemical Vapor Deposition (CVD), Pulsed Layer Deposition (PLD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

When a switching voltage is applied to the resistive switching layer in order to reduce its resistance, defects can flow into the layer and form conductive paths through the layer. The above scenario is applicable in a very similar manner to a resetting operation during which the resistive switching layer is brought to its high resistance state. When a switching voltage is applied to the layer in order to increase its resistance of the layer, the defects can flow out of the layer. The loss of defects may eventually break conductive paths in the layer.

FIG. 1 illustrates a plot of a current passing through a ReRAM cell as a function of a voltage applied to the ReRAM cell, according to some embodiments. The high resistance state (HRS) is defined by line 122, while the low resistance state (LRS) is defined by 124. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "read" voltage or simply a reading voltage and indicated as $V_{read}$. If the ReRAM cell is in its HRS (represented by line 122), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{read}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{set}$) to the electrodes. Applying the set voltage forms one or more conductive paths in the resistance switching layer. The switching from the HRS to LRS is indicated by dashed line 126. The resistance characteristics of the ReRAM cell in its LRS are represented by line 124. When the read voltage ($V_{read}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{reset}$) is applied to the ReRAM cell to break the previously formed conductive paths in the resistance switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 2:
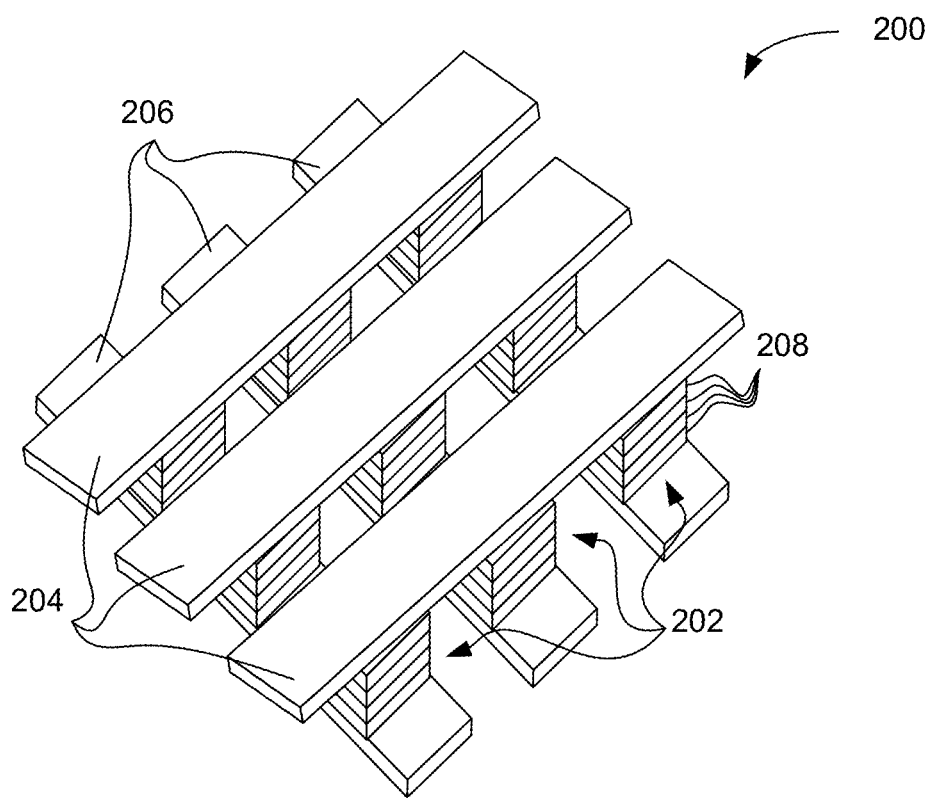
FIG. 2 illustrates a memory array of resistive switching memory elements according to some embodiments.

FIG. 2 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 202 using signal lines 204 and orthogonal signal lines 206. Signal lines such as signal lines 204 and signal lines 206 are sometimes referred to as word lines and bit lines and are used to read and write data into the elements 202 of array 200. Individual memory elements 202 or groups of memory elements 202 can be addressed using appropriate sets of signal lines 204 and 206. Memory element 202 may be formed from one or more layers 208 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 202. For example, horizontal and vertical lines 204 and 206 may be connected directly to the terminals of resistive switching memory elements 202. This is merely illustrative.

During the operation of the cross point memory array, such as a read operation, the state of a memory element 202 can be sensed by applying a sensing voltage (i.e., a "read" voltage) to an appropriate set of signal lines 204 and 206. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 204 and 206.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 3:
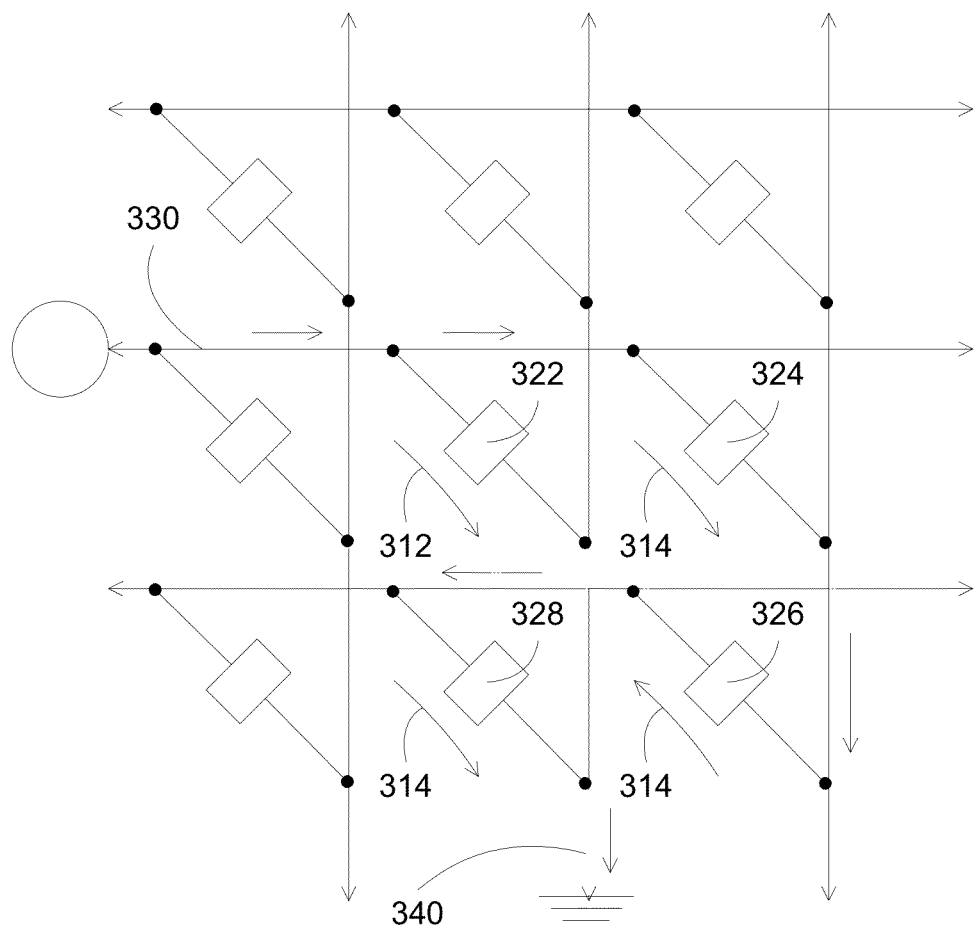
FIG. 3 illustrates sneak path currents in a cross point memory array according to some embodiments.

FIG. 3 illustrates sneak path currents in a cross point memory array according to some embodiments. A memory cell 322 can be selected, for example, for a read operation, by applying a voltage to signal line 330, and grounding signal line 340. A current can flow through the memory cell 322. However, parallel current paths, e.g., sneak path current, can exist, for example, represented by a series of memory cells 324, 326, and 328. The applied voltage (signal line 330) can generate a current 314 through memory cell 324, passing through memory cell 326, and returning to the ground (signal line 340) through memory cell 328.

There are multiple sneak path currents, and the resistances of the series memory cells can be smaller than that of the selected memory cell, thus can obscure the sense current through the selected memory cell during a read operation.

To reduce or eliminate the sneak path occurrence, a control device, e.g., a selector, can be used in the cross point memory array. For example, a series transistor or a diode can be located in a memory cell. The control device can isolate the selected memory cell from unselected memory cells by breaking parallel connections of the memory cells.

Figure 4:
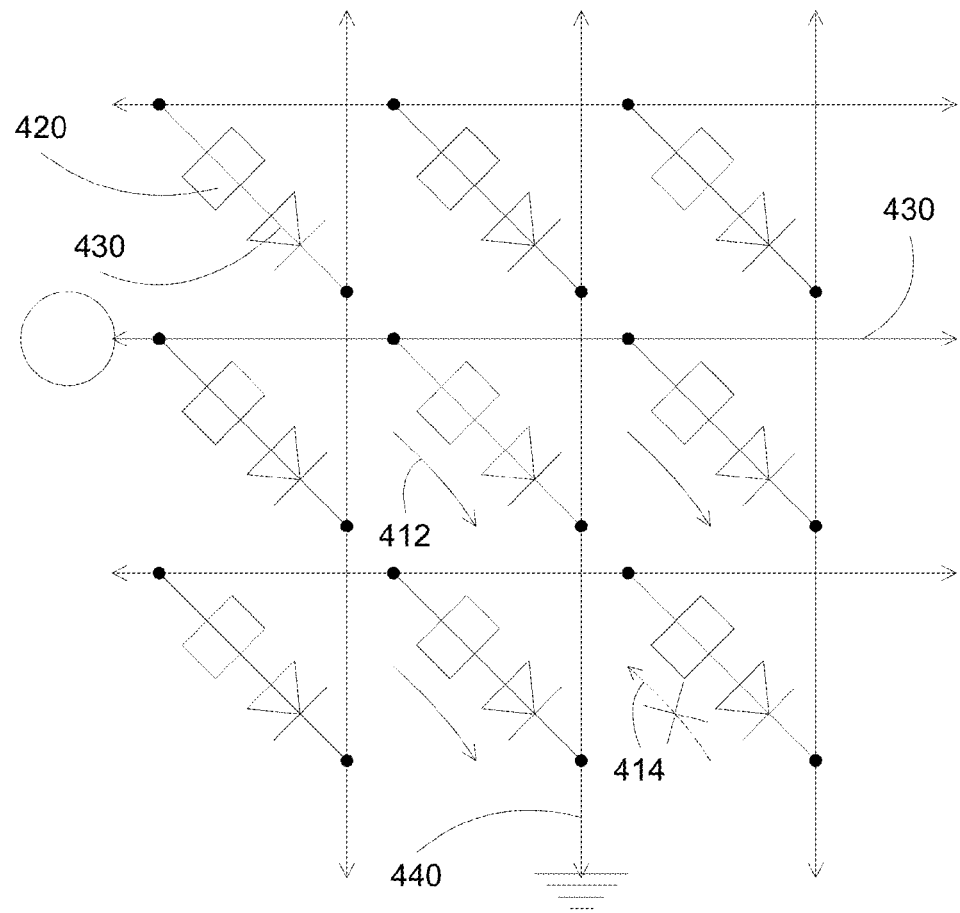
FIG. 4 illustrates a cross point memory array according to some embodiments.

FIG. 4 illustrates a cross point memory array according to some embodiments. A switching memory device can include a memory element 420 and a diode selector 430, which are both disposed between the electrodes 430 and 440. The diode selector 430 can be an intervening electrical component, disposed between electrode 430 and memory element 420, or between the electrode 440 and memory element 420. In some embodiments, the diode selector 430 may include two or more layers of materials that are configured to allow or inhibit the current flow in different directions through the memory element 420 when that memory element is not selected to read. For example, the diode selector can prevent a sneak path current 414 when the sense current 412 is generated.

In some embodiments, a metal-insulator-metal capacitor (MIMCAP) device is provided that can function as a diode selector that can be suitable for memory device applications. The MIMCAP device can have lower thermal budget as compared to Schottky diodes and controllable lower barrier height and lower series resistance as compared to MIMCAP tunneling diodes, which utilizes a tunneling effect through the insulator layer.

In some embodiments, the MIMCAP device can include a low leakage dielectric layer and a high leakage dielectric layer. The layers can be sandwiched between two electrodes.

In some embodiments, the MIMCAP device can include two layers of dielectric disposed between two layers of electrodes. The electrodes and dielectrics can form an asymmetric device, with respect to the two electrode/dielectric stacks. For example, the dielectric layers can include two dielectric layers having different defect levels, e.g., one dielectric layer has more embedded defects then the other dielectric layer. The electrodes can include two conductive materials having different work function values. The defect level and the work function differences can be optimized to achieve a high forward bias current density (e.g., $10^5$-$10^6$ A/cm$^2$) and a high forward to reverse rectification ratio (e.g., $10^7$-$10^8$).

In some embodiments, methods to form MIMCAP devices are provided, including performing treatments after depositing the low defect dielectric layer, the high defect dielectric layer, and/or the electrodes. The treatment can include rapid thermal annealing or plasma treatment, such as a rapid thermal anneal in temperatures between 200 and 400 C, plasma oxygen anneal, and/or in-situ annealing after deposition. The treatments can modify the deposited layers to achieve the desired device characteristics.

Figure 5A:
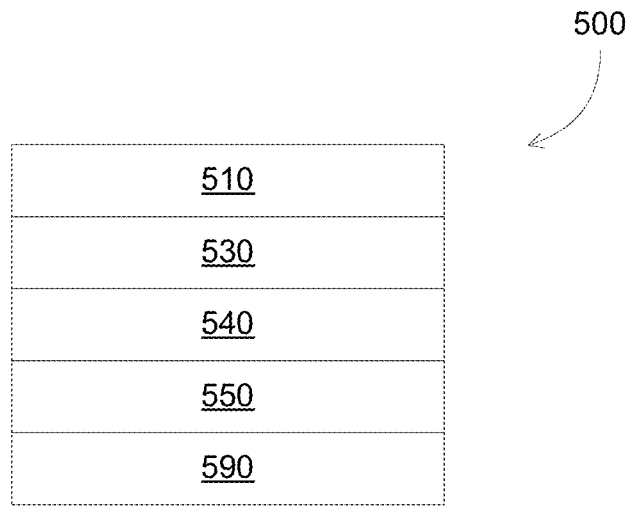
FIGS. 5A-5B illustrate an example of a MIMCAP device together with a memory stack incorporating the MIMCAP device according to some embodiments.
Figure 5B:
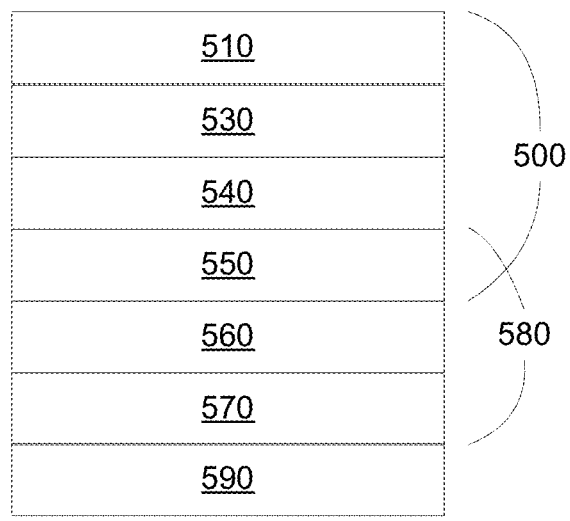

FIGS. 5A-5B illustrate an example of a MIMCAP device together with a memory stack incorporating the MIMCAP device according to some embodiments. In FIG. 5A, a MIMCAP device 500 can be disposed on a substrate 590, and can include a low defect dielectric layer 530, and a high defect dielectric layer 540, sandwiched between two electrodes 510 and 550.

In FIG. 5B, a MIMCAP device 500 can be placed in series with a memory element 580, which is disposed on a substrate 590. The memory element can include a switching layer 560 sandwiched between two electrodes 550 and 570. As shown, the MIMCAP device 500 and the memory element 580 share a common electrode 550.

In some embodiments, the MIMCAP device can include a low defect dielectric layer such as a stoichiometric layer of $TiO_2$, and a high defect dielectric layer such as a non-stoichiometric layer of $TiO_{2-x}$ with x between 0 and 2. The two dielectric layers can be sandwiched between two electrodes.

In some embodiments, the MIMCAP device can include a low defect dielectric layer and a high defect dielectric layer, sandwiched between two different electrodes having different work functions. For example, platinum and ruthenium electrodes can be used, sandwiching a dielectric stack of $TiO_2$ and $TiO_{2-x}$.

The dielectric layers can include $TiO_2$, $ZnO_2$, strontium titanate (STO), indium gallium zinc oxide (IGZO), or $SnO_2$. The dielectric layer can include a transition metal oxide. The low defect dielectric layer can include stoichiometric oxides, and can be achieved by an annealing process, for example, in oxygen ambient. The high defect dielectric layer can include non-stoichiometric oxides, and can be achieved by depositing in oxygen-deficient ambient. The two dielectric layers can have same composition elements, e.g., $TiO_2$ and $TiO_{2-x}$ having different oxygen concentrations. The two dielectric layers can have different composition elements, e.g., $TiO_2$ and $HfO_x$. The thickness of the dielectric layer can be between 5 and 25 nm.

The electrodes can include Pt, Ru, Ti, TiN, Ag, Ni, Co, an alloy of these elements, or a conductive metal oxide of these elements. The two electrodes can have same composition elements, e.g., both electrodes can include Pt, or can have different composition elements, e.g., one electrode can include Pt and the other electrode Ru. The electrodes can have any thickness, such as between 5 and 500 nm.

Current passing through the Schottky junction can depend on the difference in work function between the two electrodes. Generally, smaller leakage current occurs for higher work function difference. Thus the work function difference between the two electrodes can reduce the leakage current in a reverse bias of the MIMCAP device. In the case of a stack of high/low defect dielectric, the work function difference can enhance the forward current in a forward bias of the MIMCAP device.

Figure 6A:
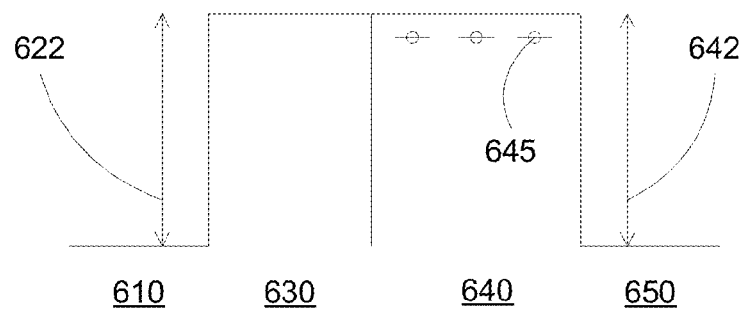
FIGS. 6A-6C illustrate an example of a band diagram for a MIMCAP device according to some embodiments.
Figure 6B:
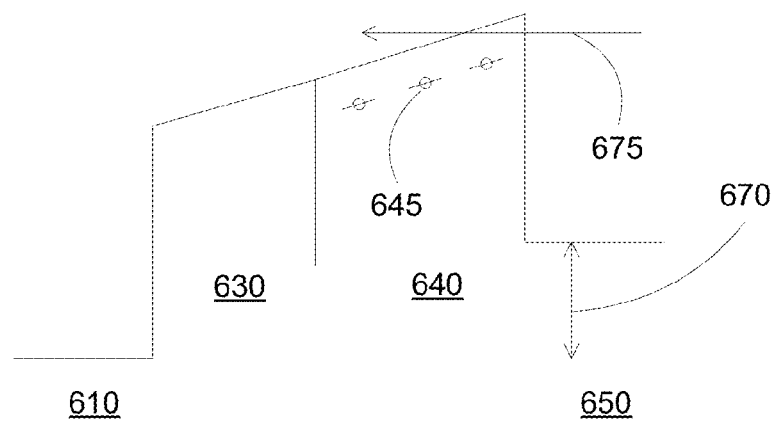
Figure 6C:
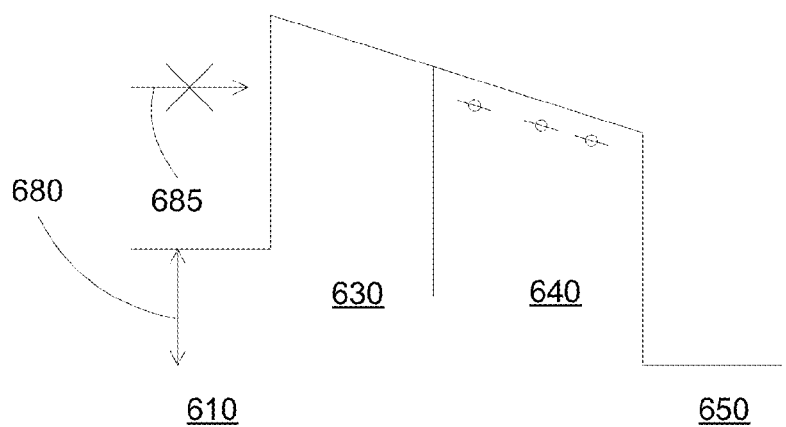

FIGS. 6A-6C illustrate an example of a band diagram for a MIMCAP device according to some embodiments. The MIMCAP device can have similar electrode material, e.g., similar work function. In FIG. 6A, dielectric layers 630 and 640 are sandwiched between two electrodes 610 and 650. The band diagram shows the Fermi levels of the two electrodes 610 and 650 and the electron portion of the band gap, e.g., the conduction band minimum, of the dielectric layers 630 and 640. As shown, the two electrodes can have similar material, and thus the Fermi levels can be the same, resulting in a level energy band for the dielectric layer. The dielectric layer 640 can have higher defect level than the dielectric layer 630, as shown by defects 645.

In FIG. 6B, a forward bias is applied to the MIMCAP device. For example, a positive voltage can be applied to the electrode 610, lowering the Fermi level of the electrode 610. Alternatively, a negative voltage 670 can be applied to the electrode 650, raising the Fermi level of the electrode 650. There can be high currents 675 passing through the MIMCAP device in the forward bias, since the charges in the defect level 645 can pass through the low defect dielectric layer 630, and travel to the electrode 610. Similar behaviors can be seen for hole conduction. The explanation is illustrative. Specific operations of the MIMCAP device can depend on the materials, the properties, and the process conditions of the device.

In FIG. 6C, a reverse bias is applied to the MIMCAP device. For example, a positive voltage can be applied to the electrode 650, lowering the Fermi level of the electrode 650. Alternatively, a negative voltage 680 can be applied to the electrode 610, raising the Fermi level of the electrode 610. There is no current 685 (or only minimum leakage current) passing through the MIMCAP device in the reverse bias, since the charges can be blocked by the Schottky barrier and the low defect dielectric layer 630. The above description is schematic and illustrative, served only to show a possible operation of the MIMCAP device.

In some embodiments, the low defect dielectric layer can function to restrict the current flow across the MIMCAP device, especially in the reverse bias condition. The leakage of the low defect dielectric layer can be optimized to not significantly affect the current flow during the forward bias, and to significantly limit the current flow during the reverse bias. The low defect dielectric layer can include $TiO_2$, $ZnO_2$, strontium titanate (STO), indium gallium zinc oxide (IGZO), $SnO_2$, or a transition oxide. The low defect dielectric layer can include stoichiometric oxides, and can be achieved by an annealing process, for example, in oxygen ambient. The thickness of the low defect dielectric layer can be between 2 and 15 nm.

In some embodiments, the high defect dielectric layer can function to enhance the current flow across the MIMCAP device, especially at the forward bias condition. The leakage of the high defect dielectric layer can be optimized to allow high current flow during the forward bias while not provide current flow during the reverse bias. The high defect dielectric layer can include non-stoichiometric $TiO_2$, $ZnO_2$, strontium titanate (STO), indium gallium zinc oxide (IGZO), or $SnO_2$. The high defect dielectric layer can include doped $TiO_2$, doped $ZnO_2$, doped strontium titanate (STO), doped indium gallium zinc oxide (IGZO), or doped $SnO_2$, with the doping levels optimized to achieve a desired defect level. The thickness of the high defect dielectric layer can be between 2 and 15 nm.

In some embodiments, the low leakage dielectric layer and the high leakage dielectric layer are interdependent, wherein the combination of these two layers can enhance the diode characteristics of the MIMCAP device, providing high current flow during forward bias and negligible current flow during reverse bias. For example, the low and high defect dielectrics can include a stoichiometric composition and a non-stoichiometric composition of the same oxide. In some embodiments, the high defect dielectric layer can have a defect level higher than that of the low defect dielectric layer.

Figure 7A:
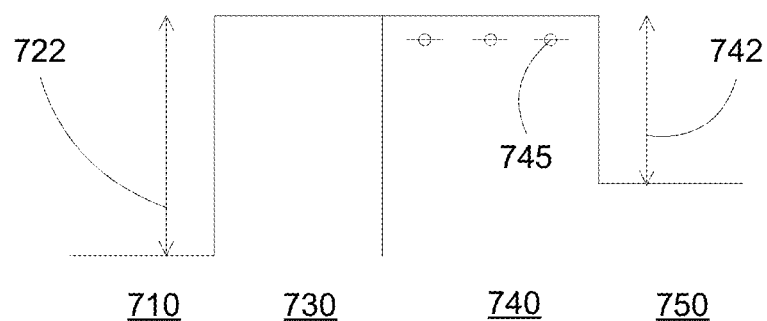
FIGS. 7A-7B illustrate an example of a band diagram for a MIMCAP device having different work functions according to some embodiments.
Figure 7B:
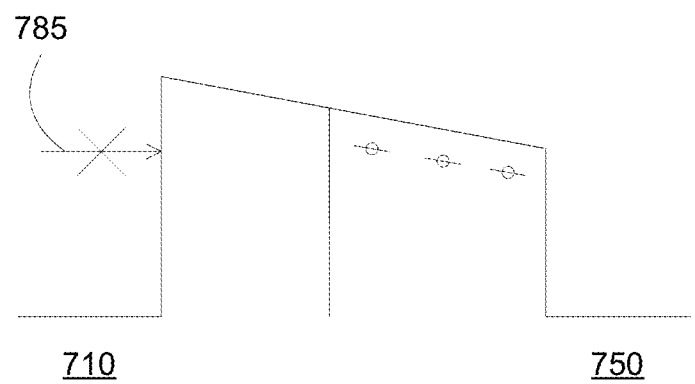

FIGS. 7A-7B illustrate an example of a band diagram for a MIMCAP device having different work functions according to some embodiments. The different work functions can serve to change a slope of an energy band for the dielectric layers between two electrodes. In FIG. 7A, dielectric layers 730 and 740 are sandwiched between two electrodes 710 and 750. The band diagram shows the Fermi levels of the two electrodes 710 and 750 and the electron portion (e.g., the conduction band minimum) of the band gap of the dielectric layers 730 and 740. As shown, the two electrodes can include different materials, showing different work function values 722 and 742 with the work function 722 greater than the work function 742.

In FIG. 7B, an equilibrium configuration is shown. After reaching equilibrium, the Fermi levels can be aligned, resulting in a sloped energy band for the dielectric layers 730 and 740 between the two electrodes 710 and 750. The slope shows higher barrier height at the low defect dielectric 730, resulting in lowering the current 785 in a reverse bias.

Figure 8A:
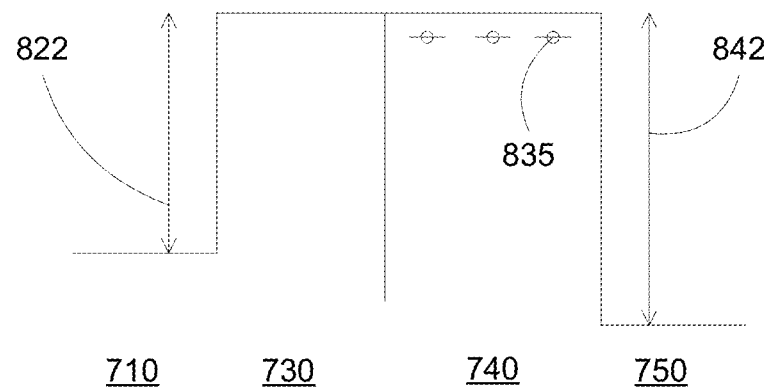
FIGS. 8A-8B illustrate an example of a band diagram for a MIMCAP device having different work functions according to some embodiments.
Figure 8B:
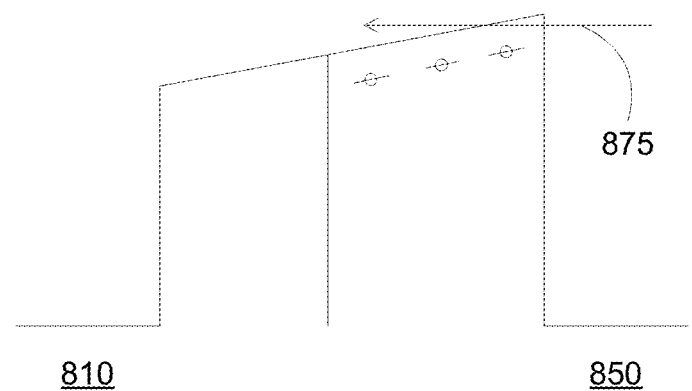

FIGS. 8A-8B illustrate an example of a band diagram for a MIMCAP device having different work functions according to some embodiments. The different work functions can serve to change a slope of an energy band for the dielectric layers between two electrodes. In FIG. 8A, dielectric layers 830 and 840 are sandwiched between two electrodes 810 and 850. The band diagram shows the Fermi levels of the two electrodes 810 and 850 and the electron portion (e.g., the conduction band minimum) of the band gap of the dielectric layers 830 and 840. As shown, the two electrodes can include different materials, showing different work function values 822 and 842 with the work function 822 smaller than the work function 842.

In FIG. 8B, an equilibrium configuration is shown. After reaching equilibrium, the Fermi levels can be aligned, resulting in a sloped energy band for the dielectric layers 830 and 840 between the two electrodes 810 and 850. The slope shows higher barrier height at the high defect dielectric 840, resulting in increasing the current 875 in a forward bias.

In some embodiments, the work function difference, and the configurations of the electrodes can be optimized to achieve high forward current and high ratio of forward to reverse current. For example, by lowering the work function of the electrode adjacent to the high defect dielectric layer, a lower reverse current can be achieved. In contrast, by lowering the work function of the electrode adjacent to the low defect dielectric layer, a higher forward current can be achieved. An optimal ratio of forward and reverse current can be achieved by selecting the electrodes to provide a lower work function at the side of the high defect dielectric, e.g., lowering the reverse current as compared to electrodes having similar work functions. The work function difference between the two electrodes can be between 1 and 2 eV, with the electrode next to the high defect dielectric having lower work function.

Figure 9:
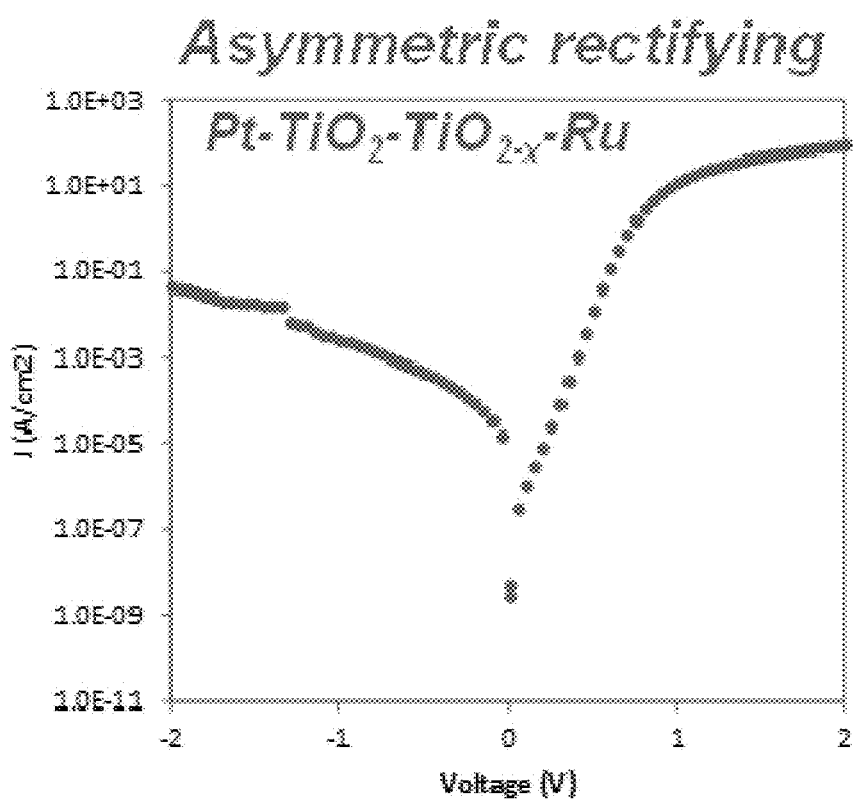
FIG. 9 illustrates an I-V response for an asymmetric current selector according to some embodiments.

FIG. 9 illustrates an I-V response for an asymmetric current selector according to some embodiments. The MIMCAP current selector includes a $Pt/TiO_2/TiO_{2-x}/Ru$ stack. The $TiO_2$ layer and the $TiO_{2-x}$ layer were deposited in similar conditions, with the $TiO_2$ layer additionally treated in an oxidizing anneal to minimize oxygen vacancies, resulting in a low defect dielectric layer. The $TiO_{2-x}$ layer was not fully treated so that the oxygen vacancies were not fully passivated, resulting in a high level of defects. The Pt and Ru electrodes have a work function difference of about 1.3 eV, e.g., the work functions of Pt and Ru are 5.9 eV and 4.7 eV, respectively. The Ru electrode has lower work function, and is placed next to the high defect dielectric layer of $TiO_{2-x}$. The asymmetrical current selector can have a diode-like behavior, with rectifying behavior in one sweep direction and ohmic in the other. The devices with smaller feature sizes, e.g., <100 nm×100 nm, can have much higher forward current density at 2V, and can be able to meet the switching current requirements for resistive memory arrays such as PCM and ReRAM. The MIMCAP device can function as a diode, e.g., having asymmetric current behavior with respect to the applied voltage polarities. For example, at forward bias, there can be higher current through the MIMCAP device as compared to the current at a same voltage at reverse bias.

In some embodiments, methods to form MIMCAP devices are provided. The methods can include depositing a low defect dielectric layer, a high defect dielectric layer, at least one electrode, together with optionally performing treatments after each layer. The treatment can include rapid thermal annealing or plasma treatment, such as a rapid thermal anneal in temperatures between 400 and 550 C, plasma oxygen anneal, and/or in-situ annealing after deposition. The treatments can modify the deposited layers to achieve the desired device characteristics.

FIG. 10 illustrates a flowchart for forming a MIMCAP device according to some embodiments. The described flowchart is a general description of techniques used to form the MIMCAP devices described above. The flowchart describes techniques for forming a MIMCAP device generally including two electrodes and multiple dielectric layers disposed therebetween. Although certain processing techniques and specifications are described, it is understood that various other techniques and modifications of the techniques described herein may also be used.

In operation 1000, a first layer is formed. The first layer can be operable as an electrode. The first layer can be formed on a substrate, for example, a silicon substrate that may include one or more layers already formed thereon. In some embodiments, the first layer can be a polysilicon layer or a metal containing layer. For example, the first layer can be a highly doped polysilicon layer that is formed using a conventional CVD or ALD type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have a resistive memory element and the electrode formed thereon as well. Alternatively, in the case where no other device is provided, the first layer can be the bottom electrode. The first electrode layer can include Pt, Ru, Ti, TiN, Ag, Ni, Co, or any combination, mixture, alloy, or oxide alloy thereof that can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, PLD, PVD, CVD, evaporation, etc. can also be used to deposit the first electrode. In some embodiments, the first electrode is in contact with one of the signal lines. The first electrode may have any thickness, for example between about 5 nm and about 500 nm thick.

In operation 1010, a second layer can be formed on the first layer. The second layer can be a dielectric layer. The second layer can include $TiO_2$, $ZnO_2$, strontium titanate (STO), indium gallium zinc oxide (IGZO), $SnO_2$, or any transition oxide. The thickness of the second layer can be between 3 to 15 nm. An optional treatment can be performed after forming the second layer. The treatment can include a plasma treatment or a high temperature treatment. For example, the treatment can include a rapid thermal oxidation at 400-550 C in oxygen ambient. The treatment can be performed in-situ after the deposition of the first electrode layer. The treatment can include an oxygen radical anneal, e.g., plasma anneal in an oxygen ambient at temperature between 400 and 550 C.

In operation 1020, a third layer can be formed on the second layer. The third dielectric layer can be a dielectric layer. The third layer can have more defects than the second layer. The third layer can include $TiO_x$, $ZnO_x$, strontium titanate (STO), indium gallium zinc oxide ($IGZO_x$), or $SnO_x$, e.g., non-stoichiometric compositions of the second layer. The dielectric layers can include doped $TiO_2$, doped $ZnO_2$, doped strontium titanate (STO), doped indium gallium zinc oxide (IGZO), or doped $SnO_2$, e.g., having higher defects than the second layer. The thickness of the third layer can be between 3 to 15 nm. An optional treatment can be performed after depositing the third layer. The treatment can include a plasma treatment or a high temperature treatment. The treatment can be optimized to provide higher defect levels that the defect level in the second layer. In some embodiments, the second and/or third layers can be deposited by a PVD or ALD process. For example, an ALD process can include $H_2O$ oxidant, and at less than about 200 C deposition temperature.

In operation 1030, a fourth layer is formed on the third layer. The fourth layer can be operable as an electrode. The fourth layer can include Pt, Ru, Ti, TiN, Ag, Ni, Co, or any combination, mixture, alloy, or oxide alloy thereof that can be formed using PVD or other processes. The fourth layer can have any thickness, for example between about 5 nm and about 500 nm thick.

Figure 11:
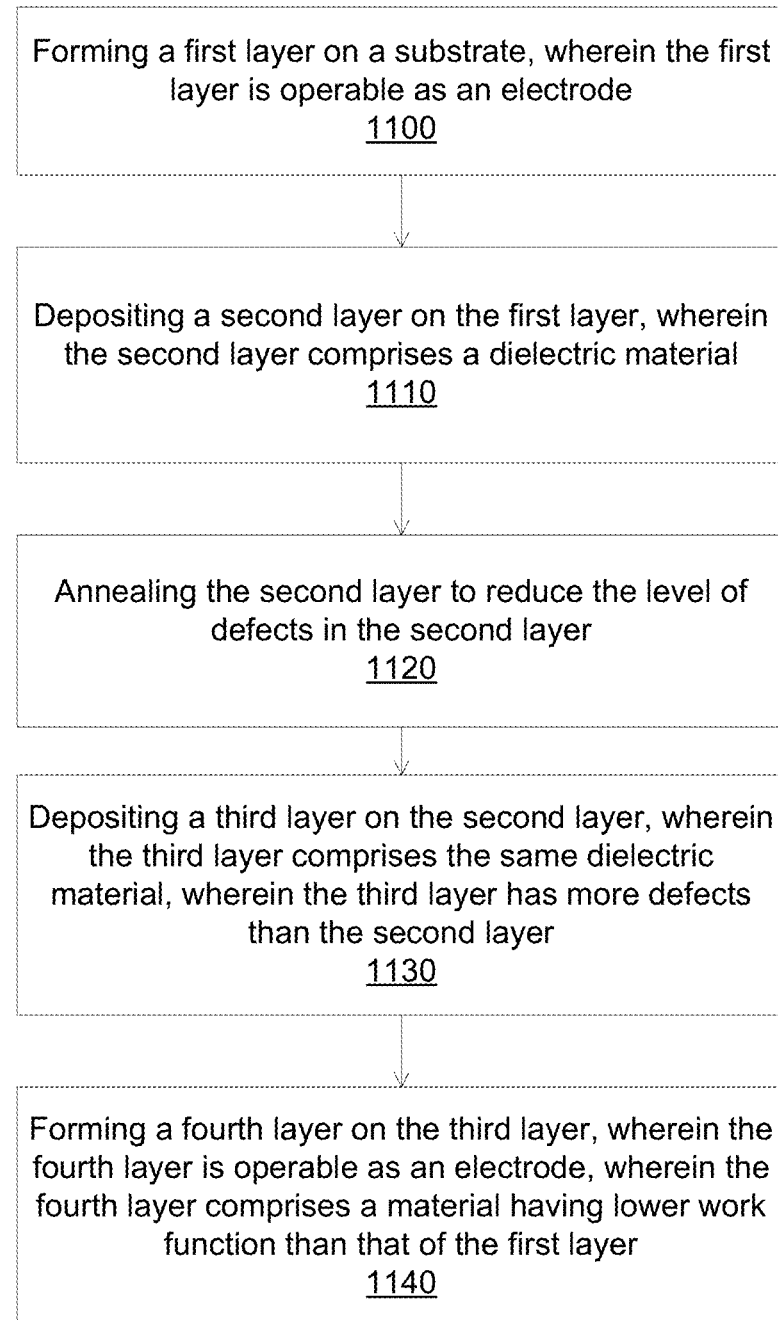
FIG. 11 illustrates a flowchart for forming a MIMCAP device according to some embodiments.

FIG. 11 illustrates a flowchart for forming a MIMCAP device according to some embodiments. In operation 1100, a first layer is formed on a substrate, for example, a silicon substrate that may include one or more layers already formed thereon. The first layer can be operable as an electrode. In operation 1110, a second layer can be deposited on the first layer. The second layer can include a dielectric material. In operation 1120, a treatment can be performed after depositing the second layer. The treatment can be operable to reduce defects in the second layer. In operation 1130, a third layer can be deposited on the second layer. The third layer can include the same dielectric material as the second layer. The third layer can be deposited using the same deposition conditions as the second layer. An optional treatment can be performed after depositing the third layer. The optional treatment can be optimized to provide the third layer with higher defect level as compared to the second layer.

In some embodiments, the second layer can include a stoichiometric composition, and the third layer can include a non-stoichiometric composition. For example, the second layer can include $TiO_2$, formed by annealing a deposited $TiO_{2-x}$ layer. The third layer can include $TiO_{2-x}$. In some embodiments, the second layer can include a more stoichiometric composition than the third layer. For example, the second layer can include $TiO_{2-y}$, and the third layer can include $TiO_{2-x}$, with y closer to 2 than x, e.g., $TiO_{2-y}$ is more stoichiometric than $TiO_{2-x}$.

In operation 1140, a fourth layer is formed on the third layer, wherein the fourth layer is operable as an electrode. The fourth layer can include materials having lower work function that the first layer. In some embodiments, the work function of the fourth layer can be 1 to 2 eV lower than that of the first layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method to form a device, the method comprising
   forming a first layer, wherein the first layer is operable as an electrode;
   forming a second layer on the first layer, wherein the second layer comprises a dielectric material;
   annealing the second layer, wherein the annealing comprises one of a rapid thermal oxidation process or a plasma annealing process in an oxygen ambient;
   forming a third layer on the second layer, wherein the third layer comprises a non-stoichiometric composition of the dielectric material, wherein the third layer has a greater concentration of defects than the second layer;
   forming a fourth layer on the third layer, wherein the fourth layer is operable as an electrode, wherein the fourth layer comprises a material having a lower work function than a work function of the first layer;
   wherein the layers are operable to have a higher current flow when biased in a first polarity and a lower current flow when biased in a second polarity.

2. A method as in claim 1 wherein the second or third layer comprises $TiO_2$, $ZnO_2$, Strontium Titanate (STO), indium gallium zinc oxide (IGZO), or $SnO_2$.

3. A method as in claim 1 wherein a thickness of the second or third layer is between 5 and 25 nm.

4. A method as in claim 1 wherein the first or the fourth layer comprises Pt, Ru, Ti, TiN, Ag, Ni, Co, a conductive oxides of these elements, or a combination thereof.

5. A method as in claim 1 wherein the annealing comprises an anneal at temperatures between 400 and 550 C.

6. A method as in claim 1 wherein the first layer comprises Pt, the second layer comprises $TiO_2$, the third layer comprises $TiO_{2-x}$ with x being less than 2, and the fourth layer comprises ruthenium.

7. A device comprising
- a first layer disposed on a substrate, wherein the first layer comprises Pt, wherein the first layer is operable as a first electrode;
- a second layer disposed on the first layer, wherein the second layer comprises a dielectric material, wherein the second layer comprises $TiO_2$, wherein the second layer is heat treated to reduce the a concentration of defects in the second layer;
- a third layer disposed on the second layer, wherein the third layer comprises $TiO_{2-x}$ with x being less than 2, wherein the third layer has a higher concentration of defects than the second layer;
- a fourth layer disposed on the third layer, wherein the fourth layer is operable as an electrode, wherein the fourth layer comprises ruthenium;
- wherein the layers are operable to have a higher current flow when biased in a first polarity and a lower current flow when biased in a second polarity.

* * * * *